United States Patent
Boerner

(10) Patent No.: US 9,466,806 B2
(45) Date of Patent: Oct. 11, 2016

(54) ELECTROLUMINESCENT DEVICE

(75) Inventor: Herbert Friedrich Boerner, Aachen (DE)

(73) Assignee: OLEDWorks GmbH, Aachen (DE)

( * ) Notice: Subject to any disclaimer, the term of this patent is extended or adjusted under 35 U.S.C. 154(b) by 344 days.

(21) Appl. No.: 13/376,206

(22) PCT Filed: May 28, 2010

(86) PCT No.: PCT/IB2010/052391
§ 371 (c)(1),
(2), (4) Date: Mar. 8, 2012

(87) PCT Pub. No.: WO2010/140097
PCT Pub. Date: Dec. 9, 2010

(65) Prior Publication Data
US 2012/0161614 A1   Jun. 28, 2012

(30) Foreign Application Priority Data

Jun. 5, 2009   (EP) .................................... 09162049

(51) Int. Cl.
*H01L 27/32*   (2006.01)
*H01L 51/50*   (2006.01)
*H01L 51/52*   (2006.01)

(52) U.S. Cl.
CPC ........... *H01L 51/50* (2013.01); *H01L 27/3239* (2013.01); *H01L 51/5203* (2013.01); *H01L 51/5268* (2013.01)

(58) Field of Classification Search
CPC ................................................. H01L 27/3239
USPC ........... 313/498–512; 315/169.3; 345/36, 45, 345/76
See application file for complete search history.

(56) References Cited

U.S. PATENT DOCUMENTS

| | | | |
|---|---|---|---|
| 5,949,186 A * | 9/1999 | Nagayama et al. | 313/504 |
| 6,203,391 B1 * | 3/2001 | Murasko | 445/24 |
| 6,501,218 B1 * | 12/2002 | Duggal et al. | 313/510 |
| 7,006,061 B2 * | 2/2006 | Takeuchi et al. | 345/76 |
| 7,064,483 B2 | 6/2006 | Otterman et al. | |
| 2002/0014628 A1 * | 2/2002 | Koyama | 257/72 |
| 2004/0164674 A1 | 8/2004 | Ottermann et al. | |
| 2006/0091796 A1 | 5/2006 | Shirogane et al. | |
| 2006/0238117 A1 * | 10/2006 | Veres et al. | 313/506 |
| 2011/0303906 A1 * | 12/2011 | Goldmann | 257/40 |

FOREIGN PATENT DOCUMENTS

| | | |
|---|---|---|
| EP | 1684550 A1 | 7/2006 |
| JP | 09134787 | 5/1997 |
| WO | 9608026 A1 | 3/1996 |
| WO | 9803043 A1 | 1/1998 |

* cited by examiner

*Primary Examiner* — Nimeshkumar Patel
*Assistant Examiner* — Christopher Raabe
(74) *Attorney, Agent, or Firm* — Stephen P. Singer

(57) ABSTRACT

An electroluminescent device (10) comprising a substrate (40) and on top of the substrate (40) a substrate electrode (20), a counter electrode (30) and an electroluminescent layer stack with at least one organic electroluminescent layer (50) arranged between the substrate electrode (20) and the counter electrode (30), characterized in that at least one image carrier body (200) is at least partially arranged on the substrate electrode (20), suitable to influence the appearance of the device (10).

22 Claims, 7 Drawing Sheets

ELECTROLUMINESCENT DEVICE

FIELD OF THE INVENTION

The invention relates to an electroluminescent device comprising a substrate and on top of the substrate a substrate electrode, a counter electrode and an electroluminescent layer stack with at least one organic electroluminescent layer arranged between the substrate electrode and the counter electrode. Furthermore, the invention relates to a method for manufacturing an electroluminescent device.

BACKGROUND OF THE INVENTION

A typical organic light emitting device (OLED) comprises a glass substrate, a transparent substrate electrode, e. g. Indium-Tin-Oxide (ITO), an electroluminescent layer stack and a reflective counter electrode. The light generated in the electroluminescent layer stack can pass the substrate material, whereas when the organic light emitting device has a homogenous layering in the lateral extension, the organic light emitting device features a substantially uniform emission of light across the entire light emitting field. In order to provide organic light emitting devices with a pattern in particular in the on-state, organic light emitting devices are known comprising pattern-layers to generate a pattern, in particular in the on-state.

The U.S. Pat. No. 7,064,483 B2 discloses an organic light-emitting diode comprising a substrate with a substrate surface, a substrate electrode being deposited on said substrate surface, at least one electroluminescent layer and a counter electrode. Moreover, said organic light emitting diode features a resistive layer with a structure, in order to generate a pattern in the light emitting field of the OLED device. Unfortunately, these types of OLEDs comprising a resistive layer for pattering the light emitting field in the on-state appear as dark mirrors in the off-state. Moreover, the variability of different appearances of the OLED device both in the on-state and in the off-state is strongly limited due to the use of said resistive layer. In particular, the application of a resistive layer does not lead to a patterning effect of the OLED device in the off-state.

SUMMARY OF THE INVENTION

Thus, the invention has for its object to eliminate the above mentioned disadvantages. In particular, it is an object of the invention to disclose an electroluminescent device with an improved variability in the appearance. Moreover, it is an object of the invention to provide an electroluminescent device with an increased flexibility in design and light effects, in particular in the off-state.

This object is achieved by an electroluminescent device comprising a substrate and on top of the substrate a substrate electrode, a counter electrode and an electroluminescent layer stack with at least one organic electroluminescent layer arranged between the substrate electrode and the counter electrode, whereas at least one image carrier body is at least partially arranged on the substrate electrode, suitable to influence the appearance of the device. The object is also achieved by a method for manufacturing the electroluminescent device according to the present invention. Preferred embodiments of the electroluminescent device and the method are defined in the subclaims. Features and details described with respect to the electroluminescent device also apply to the method and vice versa.

The present invention discloses at least one image carrier body, which is at least partially arranged on the substrate electrode, suitable to influence the appearance of the device. The image carrier body can be performed as a foil and/or a sheet of a flat extended body.

The leading idea of the present invention is to use at least one image carrier body, which is preferably carried out as an objective body and which can be applied on the surface of the substrate electrode. Thus, the idea of the present invention is not based on a layer system comprising patterning layers in separate regions. Due to the application of an objective body, preferably in a 3-dimensional extension leading to an image carrier body the variability in the appearance of the electroluminescent device is substantially increased. In particular, the flexibility in the design and light effects of the electroluminescent device is increased both in the on-state and in the off-state of the electroluminescent device.

Advantageously the image carrier body is performed as a foil and/or a sheet of a flat extended body. Accordingly, the image carrier body can be designed and influenced in the surface appearance as well as in the specific pattern, before the image carrier body is applied on the surface of the substrate electrode. The light generated in the electroluminescent layer stack leaves the device by passing the substrate electrode and the substrate material, respectively. The areas of the light emitting field, in which an image carrier body is not applied on the surface of the substrate electrode, the light emission of the device is not influenced. The light emitting in the areas, where an image carrier body is applied on the surface of the substrate electrode, the light emission is prevented by the image carrier body.

Advantageously, the image carrier body comprises a pattern, preferably one or more characters, symbols, signs and/or images, applied on the surface and/or embedded in the material of the image carrier body. On the one hand the image carrier body can form a pattern due to a specific contour of the image carrier body, applied on the surface of the substrate electrode. On the other hand the image carrier body may comprise a pattern within the surface of the image carrier body. Thus, said characters, symbols, signs and/or images can be formed by the contour of the image carrier body itself or by an image in the surface appearance of the image carrier body. Preferably, the characters, symbols, signs and/or images, which are applied on the surface and/or which are embedded in the material of the image carrier body, preferably to influence the appearance of the electroluminescent device in the off-state.

The foil can be a synthetic foil like a polypropylene-, a polyethylene-, a polycarbonate-foil or any different materials, which can be applied on the surface of the substrate electrode. In particular, said materials can be laminated on the surface of the substrate electrode by use of a laminating process. Alternatively or additionally the image carrier body can be applied on the surface of the substrate electrode by an adhesive means, in particular when the image carrier body features a non self-adhesive behavior. Next to a synthetic- or a metallic-material the image carrier body may comprise a foil or sheet of plastic, glass, ceramic, printed circuit boards, paper, wood or any other material. Generally the image carrier body features a flat extension and is not limited to a specific material.

In the context of the invention the notion electroluminescent (EL) layer stack denotes all layers prepared between the substrate and counter electrodes. In one embodiment of an EL layer stack, it comprises at last one light emitting organic electroluminescent layer prepared between the substrate and the counter electrode. In other embodiments the layer stacks may comprise several layers prepared between the substrate and the counter electrode. The several layers may be organic layers, such as one or more hole transport layers, electron blocking layers, electron transport layers, hole blocking layers, emitter layers or a combination of organic and non-organic layers. The non-organic layers may be additional electrodes in case of two or more light emitting layers within the layer stack and/or charge injection layers. In a preferred embodiment the substrate electrode and/or the counter electrode comprise at least one of the following materials: ITO, Aluminum, Silver, doped ZnO or an oxide layer.

In the context of the invention the notion substrate denotes a base material onto which the different layers of an electroluminescent device are deposited. Normally, the substrate is transparent and is made of glass. Furthermore, it may be preferable that the substrate is transparent, preferably comprising at least one of the following materials: silver, gold, glasses or ceramics. It may also be a transparent polymer sheets or foils with a suitable moisture and oxygen barrier to essentially prevent moisture and/or oxygen entering the electroluminescent device layer stack. It is also possible to use non-transparent materials like metal foils as a substrate. The substrate may comprise further layers, e.g. for optical purposes like light out-coupling enhancement or other purposes. The substrate is usually flat, but it may also be shaped into any three-dimensional shape that is desired.

In the context of the invention the notion substrate electrode denotes an electrode deposited on top of the substrate. Usually it consists of transparent ITO (Indium-Tin Oxide) optionally with an undercoating of $SiO_2$ or SiO to suppress diffusion of mobile atoms or ions from the glass into the electrode. For a glass substrate with an ITO electrode, the ITO is usually the anode, but in special cases it can also be used as the cathode. In some cases, thin Ag or Au layers, typically with a thickness of about 8 nm to 15 nm, are used single or in combination with ITO as the substrate electrode.

If a metal foil is used as the substrate, it takes also the role of the substrate electrode, either anode or cathode. The notation on-top-of denoted the sequence of the listed layers. This notation explicitly comprises the possibility of further layers in between the layer denoted as on top of each other. For example, there might be additional optical layers to enhance the light out-coupling arranged between substrate electrode and substrate.

In the context of the invention the notion counter electrode denotes an electrode away from the substrate. It is usually non-transparent and made of Al or Ag layers of sufficient thickness such that the electrode is reflecting, the thickness amounts typically 100 nm for Al and 100 nm to 200 nm for Ag. It is usually the cathode, but it can also be biased as the anode. For top-emitting or transparent electroluminescent devices the counter electrode has to be transparent. Transparent counter electrodes are made of thin Ag or Al layers with a thickness of about 5 nm to 15 nm or of ITO layers deposited on top of the other previously deposited layers.

In the context of the invention an electroluminescent device with a combination of a transparent substrate, a transparent substrate electrode and a non-transparent counter electrode, which is usually reflective, emitting the light through the substrate is called "bottom-emitting".

In case of electroluminescent device comprising further electrodes, in certain embodiments both substrate and counter electrodes could be either both anodes or both cathodes, when the inner electrodes are driven as cathodes or anodes. Furthermore, in the context of the invention an electroluminescent device with a combination of a non-transparent substrate electrode and a transparent counter electrode, emitting the light through the counter electrode is called "top-emitting".

In the context of the invention the notion transparent electroluminescent device denotes an electroluminescent device, where the substrate, the substrate electrode, the counter electrode and the encapsulation means are transparent. Here the electroluminescent device is both, bottom and top-emitting.

In the context of the invention a layer, substrate or electrode is called transparent if the transmission of light in the visible range is more than 50%; the rest being absorbed or reflected. Furthermore, in the context of the invention a layer, substrate or electrode is called semi-transparent if the transmission of light in the visible range is between 10% and 50%; the rest being absorbed or reflected. In addition, in the context of the invention light is called visible light, when it possesses a wavelength between 450 nm and 650 nm. In the context of the invention light is called artificial light, when it is emitted by the organic electroluminescent layer of the electroluminescent device.

Furthermore, in the context of the invention a layer, connector or construction element of an electroluminescent device is called electrically conducting if its electrical resistance is less than 100000 Ohm. In the context of the invention passive electronic components comprise resistors, capacitors and inductivities. Furthermore, in the context of the invention active electronic components comprise diodes, transistors and all types of integrated circuits.

In the context of the invention a layer, substrate, electrode or a construction element of an electroluminescent device is called reflective if light incident on its interface is returned according to the law of reflection: the macroscopic angle of incidence equals the macroscopic angle of reflection. Also the term specular reflection is used in this case. Furthermore, in the context of the invention a layer, substrate, electrode or a construction element of an electroluminescent device is called scattering if light incident on it is not returned according to the law of reflection: macroscopic angle of incidence is not equal to the macroscopic angle of the returned light. There is also a distribution of angles for the returned light. Instead of scattering, the term diffuse reflection is also used.

According to another embodiment the image carrier body is attached to the substrate electrode by adhesive means, preferred comprising glue. By the use of glue for applying said image carrier body on top of the substrate electrode, a simple and easy manufacturing process is provided.

Generally the adhesive means may form an optical transparent adhesive means, featuring a high index of refraction and preferably at least matching the index of refraction of the substrate, in order to arrange an optical contact between the image carrier body and the substrate electrode. By the use of glue with a high optical transparency the optical transition between the substrate and the image carrier body is optimized. Preferably, the index of refraction of the glue is at least equal to the index of refraction of the substrate material but equal to or less than the refractive index of the image carrier body. Typical values for the refractive indexes of the glass substrate are 1.51 to 1.54 and for the substrate electrode 1.9 to 2.0.

In a preferred embodiment the adhesive means and in particular the glue is anhydrous and/or water free. In the context of the invention, the notion water free and/or anhydrous describes the fact, that no degradation due to water content during the average lifetime of an electroluminescent device can be observed by the naked eye. A visible degradation of the organic electroluminescent layer due to water diffusing into the layer stack can take the form of growing black spots or shrinkage of the emissive region from the edges. The notion water free and/or anhydrous not only depends on the conductive glue itself but also on the amount of water, which can be absorbed by the organic electroluminescent layer without damaging it.

In a further preferred embodiment the electroluminescent device may comprise moisture and/or oxygen barriers. In the context of the invention layers prevention harmful diffusion of moisture and/or oxygen into the layer stack are called moisture and/or oxygen barriers. Diffusion is denoted as harmful if a significant life-time reduction of the emitted light can be observed. Standard OLED devices according to the state of the art achieve shelf life times in the order of 100,000 hours or more. A significant reduction denotes a reduced life-time of about a factor of 2 or more.

According to a preferred embodiment relating to the properties of the adhesive means, the adhesive means is electrically non-conductive. Accordingly, the adhesive means forms a protective means for electrically insulating the image carrier body against the electroluminescent layer stack and the counter electrode. Advantageously, the adhesive means extend beyond the side faces of the image carrier body in order to prevent the emergence of shadowing edges in the area of the side faces of the image carrier body, and preferably the image carrier body is fully embedded in the adhesive means.

The image carrier body can be electrically conductive or electrically non-conductive. On the one hand the image carrier body can feature electrical conductivity and the protective means preferably is electrically non-conductive, the electroluminescent device appears dark in the areas of the applied electrically non-conductive protective means.

According to a preferred embodiment of the electroluminescent device the electroluminescent layer stack and the counter electrode is deposited both on the image carrier body and on the surface of the substrate electrode. Preferably, the transition in the electroluminescent layer stack and in the counter electrode between the image carrier body and the surface of the substrate electrode has a smooth shape with an angle less than 45° and preferred less than 30°, more preferred less than 20° and most preferred less than 10° related to the surface of the substrate electrode. With a smooth transition, shadowing effects will not occur in this transition region, which would lead to holes in the organic layers and the counter electrode.

According to yet another embodiment the electroluminescent device may comprise at least one electrical contact means for electrically contacting the counter electrode to an electrical power source, whereas said electrical contact means preferably features electrically conductive glue and whereas the adhesive means as a non-conductive adhesive means or the image carrier body as a non-conductive image carrier body is at least fully covering the area below the electrical contact means.

Said electrical contact means preferably features electrical conductive glue. This leads to the advantage that the 3-dimensional contact schema with a minimum risk of shorts is provided. The contact means has to be applied fully above the image carrier body in order to avoid any risk of shorts between the counter electrode and the substrate electrodes.

Usually, conductive glue consists of organic glue with conductive filler in the form of conductive flakes or particles. During the setting of the glue, the glue may displace certain shrinkage, which forces some of the filler particles into the underlying layers, creating shorts between the substrate electrode and the counter electrode. To prevent this, it is advantageous to use a protective means that is non-conductive and is between the substrate electrode and the counter electrode, namely the protective means is fully encapsulating the image carrier body.

Therefore, all known conductive glues can be used for contacting the counter electrode to an electrical source. The protective means has to cover the full area where the contact means is applied to the counter electrode, since this might be the source of shorts, but it could also be larger than the area of the contact means. To prevent a direct contact between the counter electrode and the substrate electrode, it is preferable that the protective means for encapsulating the image carrier body has a thickness and/or a hardness, which assures that the contact means can not get into electrical contact with the substrate electrode. To achieve this object in a preferred embodiment the protective means may comprise a non-conductive glue and a non-conductive image carrier body.

The image carrier body may be thick and hard enough to achieve the desired protection. According to the invention, the material of the image carrier body is not limited to any specific material and the image carrier body may comprise a plastic, a glass, a ceramic, a paper, a wooden material, a textile or any other material. The glue may base on fast curing epoxy glue, a silicone gel, polyurethane glue with high transparency for visible light. All named materials form a protective means and fulfill the achievement of an image carrier body on top of the substrate electrode.

A further advantage achieved by the usage of conductive glue as a contact means is that a substrate with only one contiguous electrode can be used, which serves as a substrate electrode for the electroluminescent device. In known OLEDs, the electrode on the substrate is at least structured into two electrical separate regions. One serving as the substrate electrode and the other one connected to the counter electrode. Thus, both the substrate electrode and the counter electrode are led in one plane to the rim of the substrate, where they can be contacted by standard means.

The disadvantage of this 2-dimensional contacting schema is that the substrate electrode as well as the counter electrode have to share the periphery of the OLED for contacting, so that the electrode on the substrate needs to be divided into at least two disjoint regions, namely the substrate electrode and the second electrode to be contacted with the counter electrode to avoid shorting the device. This disclosed 3-dimensional contacting eliminates this serious disadvantage of the 2-dimensional contacting.

Advantageously, the image carrier body comprises a scattering means for scattering light, generated by the organic electroluminescent layer, in order to enhance the outcoupling of light. Experiments have shown that the area to which the protective means is applied appears dark at normal operation of the electroluminescent device, since charge injection from the counter electrode or the substrate electrode to the electroluminescent layer stack is blocked.

Therefore, another preferred embodiment is characterized in that the image carrier body comprises at least one scattering means for scattering light generated by the electroluminescent layer whereas the scattering means may also be embedded in the protective means. This scattering means scatters and/or reflects part of the artificial light guided by the substrate. This results in brightening of the regions, where the image carrier body and in particular the protective means is arranged. As the substrate works as a light guide, the scattering means in the protective means enables this light to be scattered and reflected out of the electroluminescent device.

The scattering means may be formed by a plurality of pigments and/or flakes embedded in the protective means. This pigments and/or flakes may for example comprise: aluminum, mica-effect-pigments, titan dioxide-particles or other flakes or particles known to a person skilled in the art as scattering and/or reflecting the artificial light of the electroluminescent device. Thus, the scattering means can be applied both in the protection means and/or in the image carrier body.

The present invention is also directed to a method for manufacturing an electroluminescent device comprising a layer system with a substrate and on top of the substrate a substrate electrode, a counter electrode and an electroluminescent layer stack with at least one organic electroluminescent layer arranged between the substrate electrode and the counter electrode, whereas the method comprises at least the steps of partially or fully arranging at least one image carrier body on the substrate electrode, suitable to influence the appearance of the device and applying the organic electroluminescent layer and the counter electrode both on top of the image carrier body and on the substrate electrode.

Moreover, the method can be embodied in applying glue with a high index of refraction and preferably at least matching the index of refraction of the substrate for gluing the image carrier body on the substrate electrode and in order to arrange an optical contact between the image carrier body and the substrate electrode.

Moreover, the method may comprise the step of applying a protective means comprising glue for embedding said image carrier body in such a way, that the transition of the glue between the image carrier body and the surface of the substrate electrode features a smooth shape with an angle less than 45° and preferred less than 30°, more preferred less than 20° and most preferred less than 10° related to the surface of the substrate electrode.

According to another step of the method for manufacturing the electroluminescent device the application of the image carrier body to the substrate electrode can be performed in a protective gas atmosphere, preferably featuring nitrogen and/or argon, whereas a bake-out process is applied for curing the glue featuring a temperature at least below 100° C. and preferred below 80° C.

The aforementioned electroluminescent device and/or the method, as well as claimed components and the components to be used in accordance with the invention in the described embodiments are not subject to any special exceptions with respect to size, shape or the material selection. Technical concepts such as the selection criteria are known in the pertinent field and can be applied without limitations. Additional details, characteristics and advantages of the object of the present invention are disclosed in the subclaims and the following description of the respective figures, which are an exemplary fashion only, showing a plurality of preferred embodiments of the electroluminescent device according to the present invention.

BRIEF DESCRIPTION OF THE DRAWINGS

Further embodiments of the invention will be described with respect to the following figures, in which show.

DETAILED DESCRIPTION OF THE EMBODIMENTS

Figure 1:
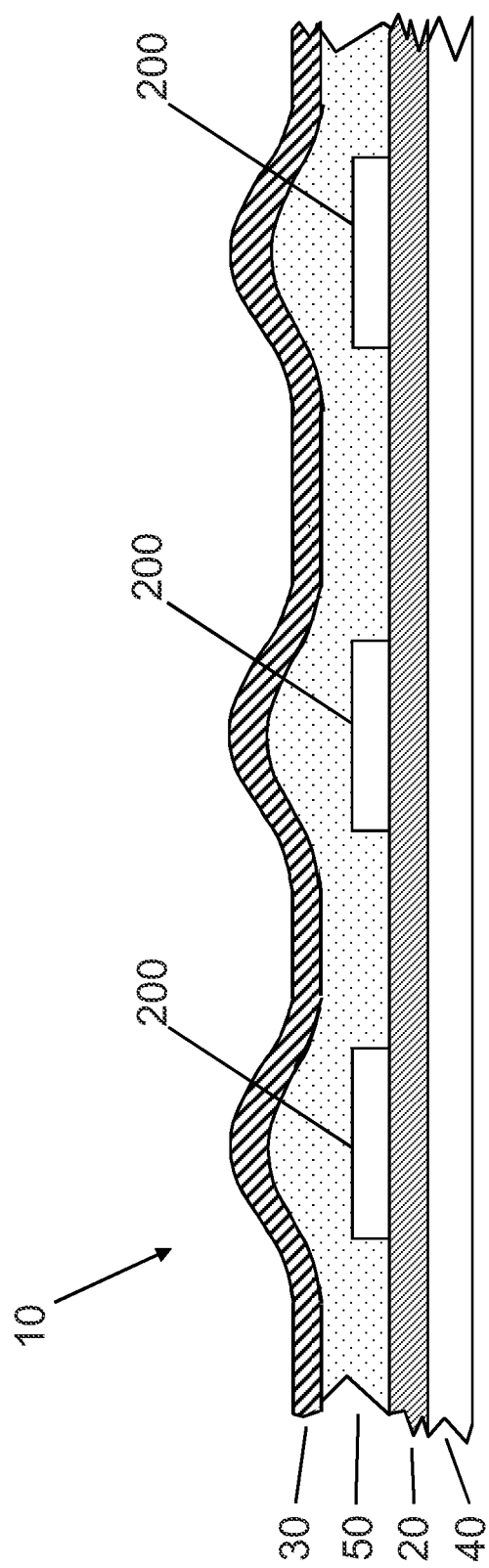
FIG. 1 an embodiment of an electroluminescent device according to the invention with an image carrier body applied on the substrate electrode, FIG. 2 the embodiment according to FIG. 1 with an applied protective means between the image carrier body and the substrate electrode, FIG. 3 the embodiment according to FIGS. 1 and 2 with a protective means fully embedding the image carrier body, FIG. 4 a detailed view of the arrangement showing the image carrier body fully embedded in the protective means, whereas the transition of the organic electroluminescent layer and the counter electrode is shown, FIG. 5 an embodiment of the electroluminescent device with an image carrier body comprising scattering means, FIG. 6 an embodiment of the electroluminescent device with an image carrier body and a contact means between the counter electrode and an encapsulation means and FIG. 7 a top view of an electroluminescent device comprising an image carrier body arranged on the surface of the substrate electrode.

In FIG. 1 an electroluminescent device 10 according to an embodiment of the invention is shown. The electroluminescent device 10 comprises a substrate electrode 20, a counter electrode 30 and an organic electroluminescent layer 50 representing the electroluminescent layer stack in this and the following embodiments. The organic electroluminescent layer 50 is arranged between the substrate electrode 20 and the counter electrode 30 forming said layer stack.

These layers are arranged on a substrate 40, forming the carrier material of the electroluminescent device 10. In the shown embodiment the substrate electrode 20 is formed by an approximately 100 nm thick layer of ITO, which is a transparent and conductive material. Onto this substrate electrode 20 the organic electroluminescent layer 50 is deposited. If a voltage is applied between the substrate electrode 20 and the counter electrode 30 some of the organic molecules within the organic electroluminescent layer 50 are exited, resulting in the emission of artificial light, which is emitted by the electroluminescent layer 50.

The counter electrode 30 is formed by a layer of aluminum, working as a mirror reflecting the artificial light through the substrate electrode 20 and the substrate 40. To emit light into the surrounding the substrate 40 in this embodiment is made of glass. Thus, the electroluminescent device 10 is a bottom emitting OLED. The electroluminescent device 10 shown in the following figures as well as the components and the components used in accordance with the invention are not shown true to their scale. Especially the thickness of the electrodes 20 and 30, the organic electroluminescent layer 50 and the substrate 40 are representing a not true scale. All figures just serve to clarify the invention.

As shown in detail, the electroluminescent device 10 comprises image carrier bodies 200 on the surface of the substrate electrode 20. The image carrier bodies 200 are partially or fully arranged on the substrate electrode 20, suitable to influence the appearance of the device 10. The image carrier bodies 200 are performed as a foil or a sheet, which is flat. As shown in the depiction, the organic electroluminescent layer 50 representing the electroluminescent layer stack and the counter electrode 30 is applied on the surface of the substrate electrode 20 as well as on the upper side of the image carrier bodies 200.

The application of the organic electroluminescent layer 50 and the counter electrode 30 on top of said surfaces is based on a vacuum deposition process as known to a person skilled in the art. The image carrier body 200 forms a flexible foil or a kind of a mask, which is manageable as a solid body, which is rigid or flexible and which can be applied on the surface of the substrate electrode 20 by an attachment process.

Figure 2:
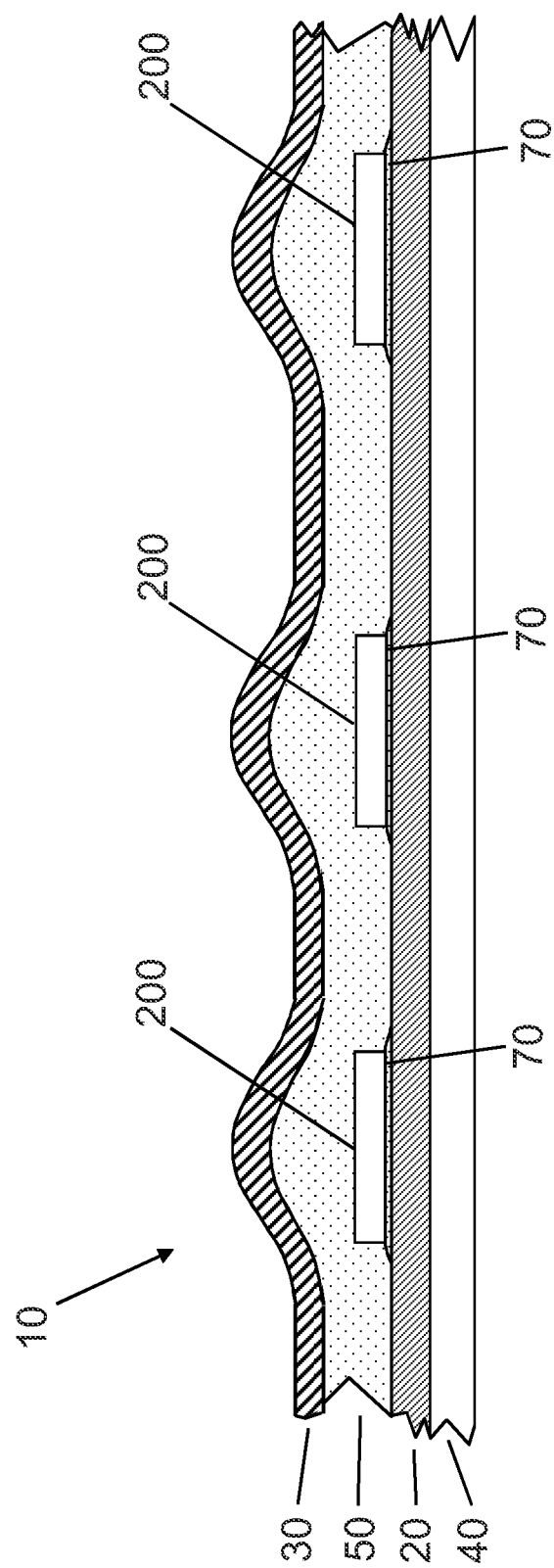

FIG. 2 shows the embodiment where the image carrier bodies 200 are attached to the surface of the substrate electrode 20 by the use of a protective means 70. The protective means 70 can be performed as glue, in order to glue the image carrier bodies 200 to the substrate electrode 20. As shown, the glue extends beyond the side faces of the image carrier body 200, in order to avoid the emergence of a shadowing edge which would lead to holes in the organic layers and in the counter electrode.

Figure 3:
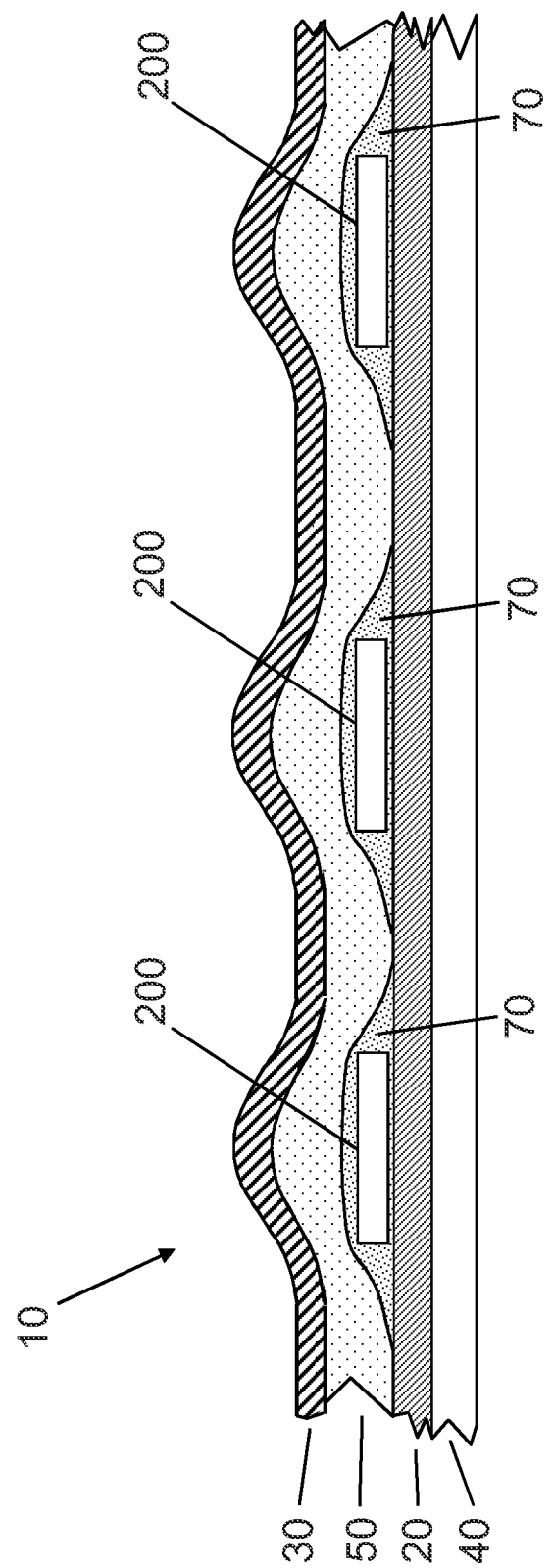

FIG. 3 shows an embodiment of the electroluminescent device 10 comprising the image carrier bodies 200 on the surface of the substrate electrode 20, whereas the image carrier bodies 200 are fully embedded in the protective means 70. As shown, the protective means 70 forms a smooth, even transition from the surface of the substrate electrode 20 and the upper side of the image carrier body 200. Due to the smooth, even transition the deposition process of the organic electroluminescent layer 50 and the counter electrode 30 is improved. The protective means 70 may comprise non-conductive glue.

Figure 4:
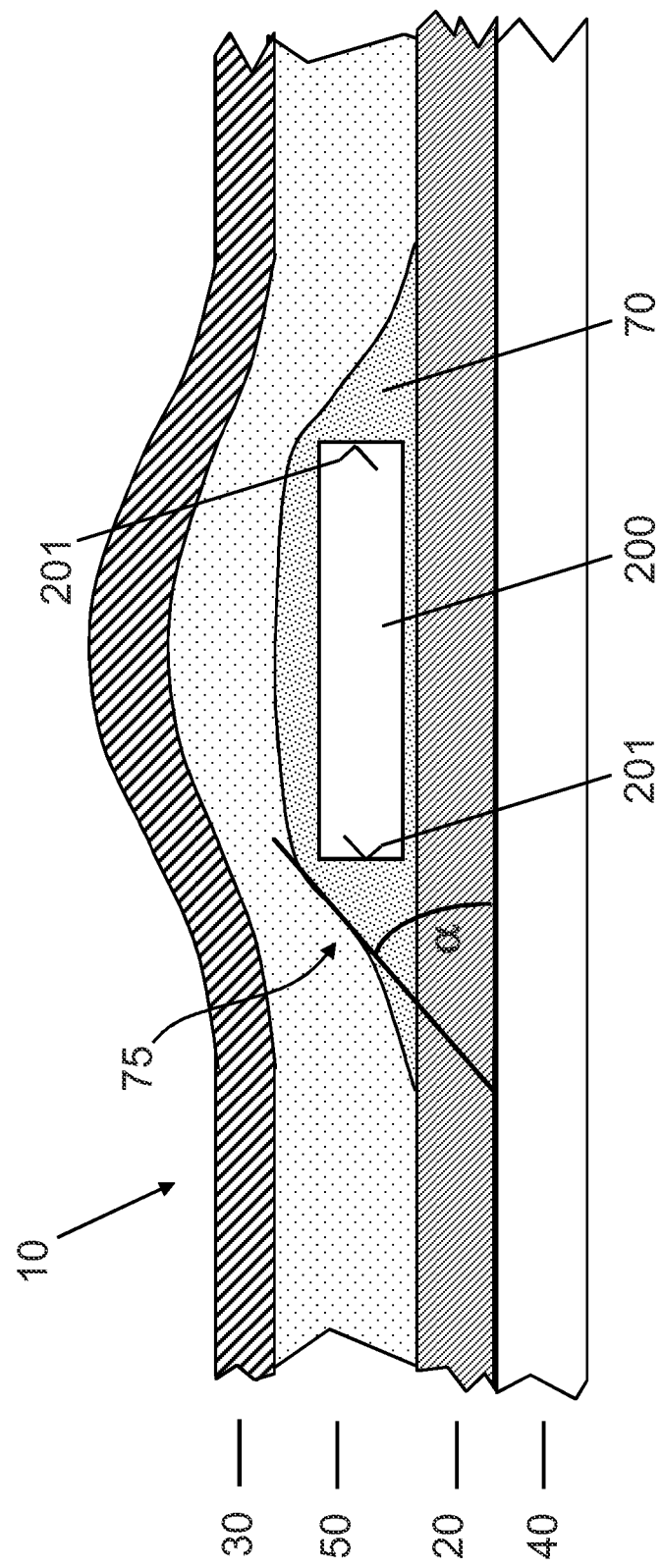

FIG. 4 shows another embodiment of the electroluminescent device 10 comprising an image carrier body 200 in a magnified depiction. The image carrier body 200 is fully embedded in the protective means 70. Moreover, the side faces 201 of the image carrier body 200 are shown on the left and on the right side of the body. The protective means 70 extend to the side faces 201 of the image carrier body in order to prevent the emergence of shadowing edges at the side faces 201 of the image carrier body 200. Moreover, the transition 75 is depicted with a transition angle $\alpha$. The transition angle $\alpha$ may feature a value of preferably 45°, preferred 30°, more preferred less than 20° and most preferred less than 10° related to the surface of the substrate electrode. As lower the value of the transition angle $\alpha$ as better is the transition 75 between the surface of the substrate electrode and the upside of the image carrier body 200 and the deposition process of the organic electroluminescent layer 50 and the counter electrode 30 respectively, is improved due to reduced shadowing effects.

Figure 5:
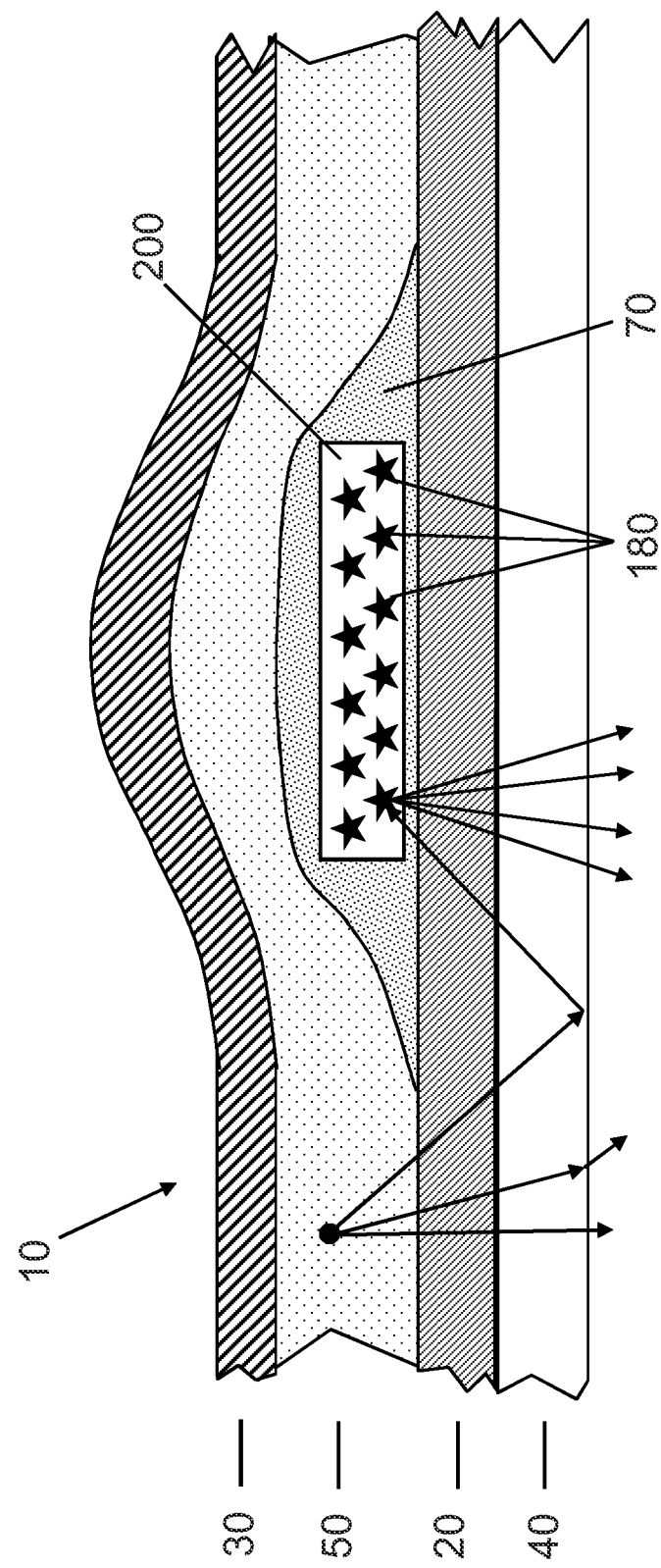

FIG. 5 shows the embodiment of the electroluminescent device 10 with an image carrier body 200 comprising a scattering means 180. As shown, the image carrier body 200 comprises at least one scattering means 180 for scattering a light, generated by the organic electroluminescent layer 50. The scattering means 180 may comprise and/or be made of pigments and/or particles. This prevents that the area beneath the image carrier body 200 might appear darker than its surrounding. These scattering means 180 may comprise mica or aluminum flakes or a material with a high refractive index like $TiO_2$ particles. The scattering means 180 also reflect parts of the artificial light and/or of visible light guided in the substrate 40 and therefore brighten the otherwise non-emissive layer beneath the image carrier body 200.

Figure 6:
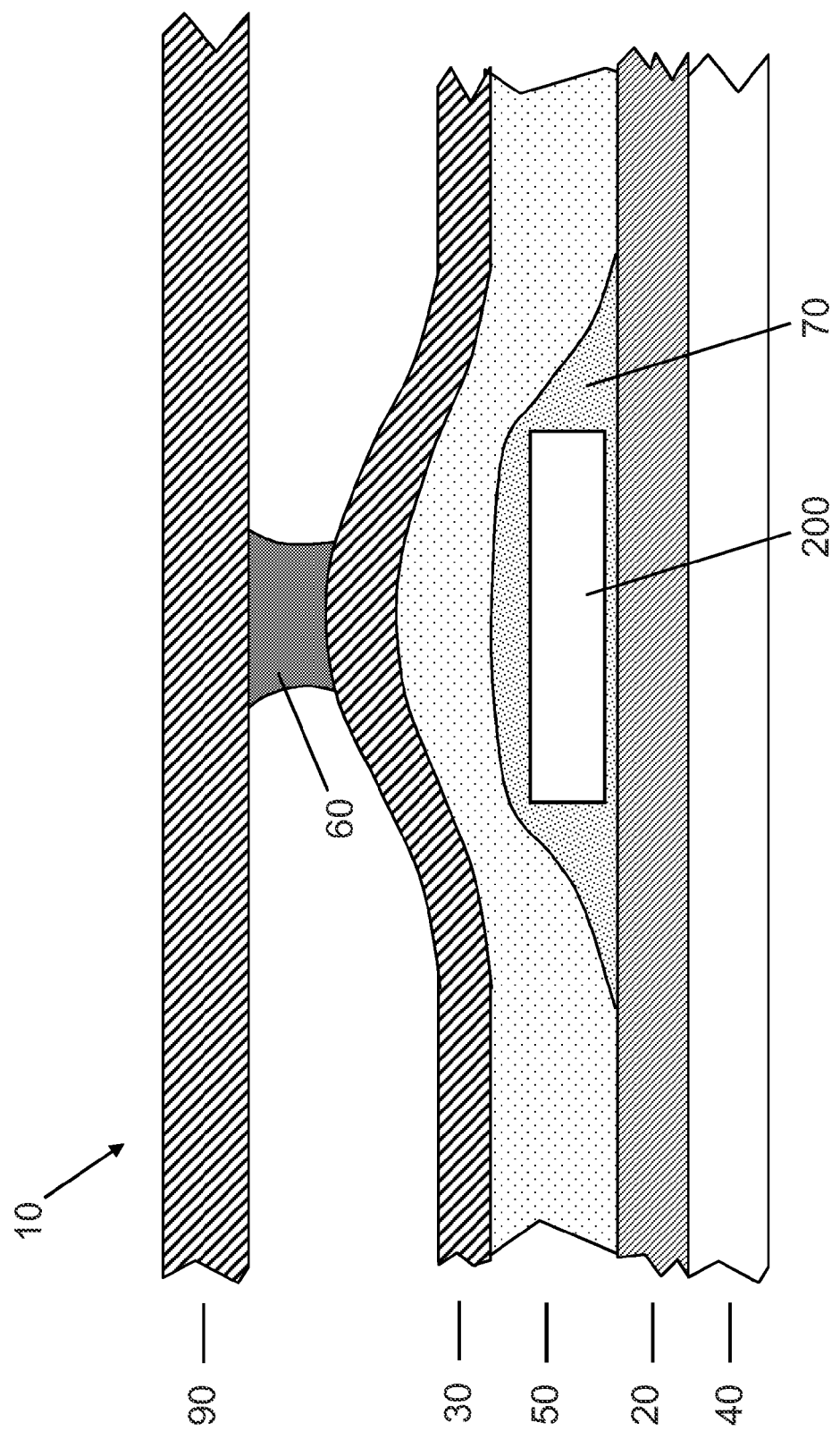

FIG. 6 shows another embodiment of the electroluminescent device 10 comprising a contact means 60 between the counter electrode 30 and an encapsulation means 90. The electroluminescent device 10 may comprise at least one or a plurality of the depicted contact means 60, arranged for electrically contacting the counter electrode 30 to an electrical power source, embodies as the encapsulation means 90, which may itself be connected to an electrical power source. The contact means 60 is therefore part of the current path leading from the counter electrode 30 to the electrical source. In the prior art contact posts are used as contact means 60, which are applied to the counter electrode 30. Such contact posts have the disadvantage that they are mechanically applied to the counter electrode 30 and often lead to shorts between the counter electrode 30 and the substrate electrode 20. To overcome this disadvantage, the invention discloses that the contact means 60 is conductive glue, applied to the counter electrode 30. Moreover, the protective means 70 has to cover the full area where the contact means 60 is applied to the counter electrode 30, since this might be the source of shorts, but it could also be larger than the area of the contact means 60.

Figure 7:
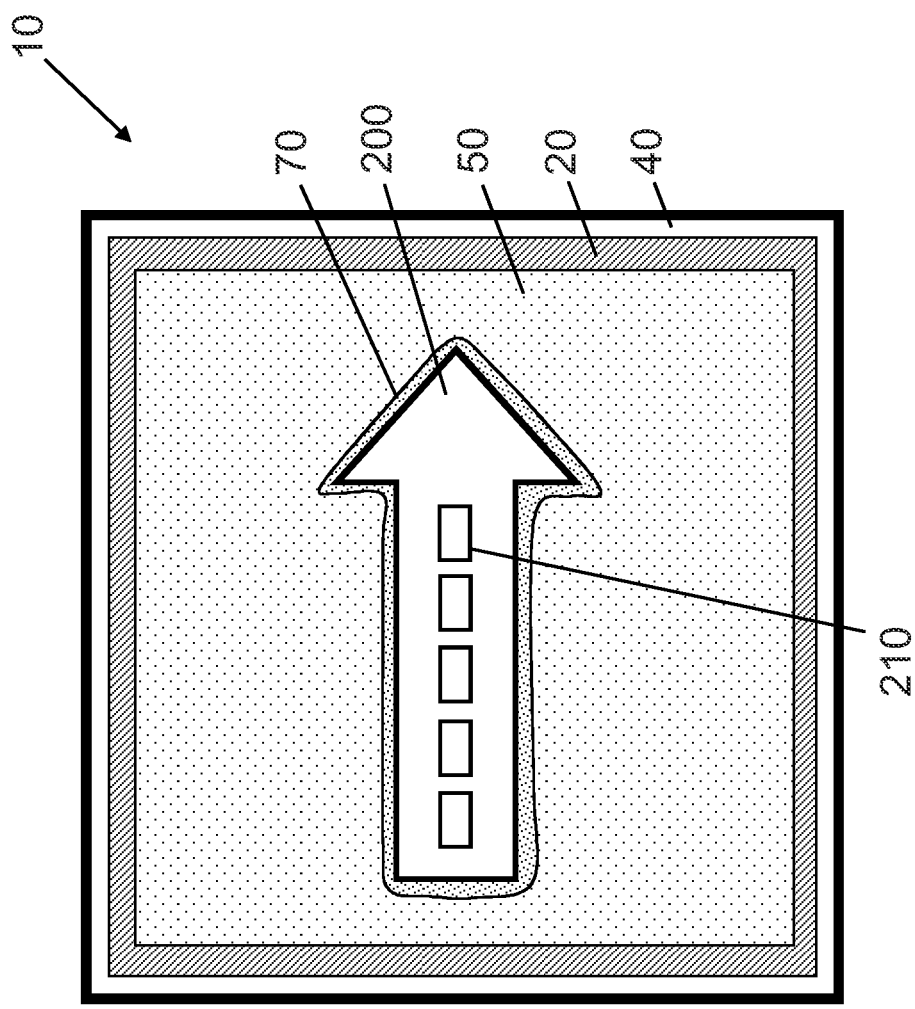

FIG. 7 features a top view of the electroluminescent device 10 comprising the substrate electrode 20, the counter electrode 30 and the organic electroluminescent layer 50. As shown, the image carrier body 200 forms a symbol, which relates to an arrow. With the pattern in the contour of the image carrier body 200, a first kind of pattern is reached. Thus, a superposition of different pattern principals can be reached by only one applied image carrier body 200 on the top of the substrate electrode 20.

The described embodiments comprise as an example an organic electroluminescent layer 50 within the layer stack. In alternative embodiments within the scope of this invention, the electroluminescent layer stack may comprise layer additional to organic electroluminescent layer 50 such as hole transparent layers, hole blocking layers, electron transport layer, electron blocking layers, charge injection layers, further conducting layer etc.

LIST OF NUMERALS

10 electroluminescent device
20 substrate electrode
30 counter electrode
31 counter electrode segment
40 substrate
50 organic electroluminescent layer
60 contact means
70 protective means
75 transition
90 encapsulation means
180 scattering means
200 image carrier body
201 side face
210 electrical component
$\alpha$ transition angle

The invention claimed is:

1. An electroluminescent device comprising:
   a substrate and, disposed on top of the substrate, a substrate electrode, a counter electrode and an electroluminescent layer stack with at least one organic electroluminescent layer arranged between the substrate electrode and the counter electrode, wherein a preformed foil or a sheet of a flat extended image carrier body is partially arranged on the top surface of the substrate electrode and under the electroluminescent stack for influencing the visual appearance of the device by preventing light emission in the on-state and wherein the shape of said image carrier body is macroscopically distinguishable when the substrate electrode, the counter electrode and the electroluminescent layer stack are in an off-state.

2. An electroluminescent device according to claim 1, wherein the image carrier body is attached to the substrate electrode by an adhesive means.

3. An electroluminescent device according to claim 2, wherein the adhesive means forms an optical transparent adhesive means, featuring an index of refraction that matches or is greater than an index of refraction of the substrate, in order to arrange an optical contact between the image carrier body and the substrate electrode.

4. An electroluminescent device according to claim 2, wherein the adhesive means is electrically non-conductive, forming a protective means for electrically isolating the image carrier body against the electroluminescent layer stack and the counter electrode.

5. An electroluminescent device according to claim 2, wherein the adhesive means extend to side faces of the image carrier body in order to prevent an emergence of shadowing edges at the side faces of the image carrier body.

6. An electroluminescent device according to claim 1, wherein a transition in the electroluminescent layer stack and in the counter electrode between the image carrier body and a surface of the substrate electrode features a smooth shape with a transition angle of less than 45' relative to the surface of the substrate electrode.

7. An electroluminescent device according to claim 1, wherein said image carrier body comprises a scattering means for scattering light, generated by the organic electroluminescent layer, in order to enhance outcoupling of the light.

8. An electroluminescent device according to claim 1, wherein said shape includes at least one of one or more characters, symbols, signs or images.

9. An electroluminescent device according to claim 1, wherein said image carrier body comprises a printed circuit board carrying inorganic LEDs for illumination purposes.

10. An electroluminescent device according to claim 1, wherein the electroluminescent device comprises at least one electrical contact means for electrically contacting the counter electrode to an electrical power source, wherein said electrical contact means comprises electrically conductive glue, wherein adhesive means attaches the image carrier body to the substrate electrode, wherein at least one of said adhesive means or said image carrier body is non-conductive, and wherein the adhesive means or the image carrier body is at least fully covering an area below and defined by the electrical contact means.

11. Method for manufacturing an electroluminescent device comprising a layer system with a substrate and, on top of the substrate, a substrate electrode, a counter electrode and an electroluminescent layer stack with at least one organic electroluminescent layer arranged between the substrate electrode and the counter electrode, wherein the method comprises:
   partially arranging a preformed foil or a sheet of a flat extended image carrier body on the top surface of the substrate electrode, wherein said image carrier body is suitable to influence the appearance of the device by preventing light emission in the on-state; and
   applying the organic electroluminescent layer and the counter electrode both on top of the image carrier body and on the substrate electrode, wherein the shape of the image carrier body is macroscopically distinguishable when said substrate electrode, said organic electroluminescent layer and said counter electrode are in an off-state.

12. Method according to claim 11, further comprising applying glue with an index of refraction that matches or is greater than an index of refraction of the substrate for gluing the image carrier body on the substrate electrode in order to arrange an optical contact between the image carrier body and the substrate electrode.

13. Method according to claim 11, further comprising applying a protective means comprising glue for embedding said image carrier body in such a way that a transition of the glue between the image carrier body and a surface of the substrate electrode features a smooth shape with an angle of less than 45° relative to the surface of the substrate electrode.

14. The electroluminescent device according to claim 5, wherein the image carrier body is fully embedded in the adhesive means.

15. The electroluminescent device according to claim 6, wherein the transition angle is less than 10° relative to the surface of the substrate electrode.

16. The method of claim 11, wherein a transition in the electroluminescent layer stack and in the counter electrode between the image carrier body and a surface of the substrate electrode features a smooth shape with a transition angle of less than 45' relative to the surface of the substrate electrode.

17. The electroluminescent device according to claim 1, wherein said image carrier body is attached, by an adhesive, between said substrate electrode and at least a portion of the electroluminescent layer stack, wherein the adhesive extends passed side faces of the image carrier body such that an emergence of shadowing edges at the side faces of the image carrier body is mitigated or prevented.

18. The electroluminescent device according to claim 17, further comprising a contact element that electrically couples the counter electrode to an electrical power source, wherein the image carrier body is disposed above the substrate electrode and wherein the contact element is disposed perpendicularly above the image carrier body.

19. The electroluminescent device according to claim 17, wherein said adhesive encapsulates said image carrier body and wherein said substrate electrode and said electroluminescent layer stack enclose said adhesive.

20. The electroluminescent device according to claim 1 wherein the preformed foil or a sheet of a flat extended image carrier body is an electrically conductive metallic material.

21. The electroluminescent device according to claim 20 wherein the preformed foil or a sheet of a flat extended image carrier body is attached to the substrate electrode by an adhesive means wherein the adhesive means is electrically nonconductive, forming a protective means.

22. The electroluminescent device according to claim 21 wherein the protective means contains scattering means.

* * * * *